(12) United States Patent
Kelkar et al.

(10) Patent No.: US 9,324,687 B1
(45) Date of Patent: Apr. 26, 2016

(54) WAFER-LEVEL PASSIVE DEVICE INTEGRATION

(71) Applicant: Maxim Integrated Products, Inc., San Jose, CA (US)

(72) Inventors: Amit S. Kelkar, Flower Mound, TX (US); Karthik Thambidurai, Plano, TX (US); Peter R. Harper, Gilroy, CA (US); Viren Khandekar, Flower Mound, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 134 days.

(21) Appl. No.: 13/930,601

(22) Filed: Jun. 28, 2013

Related U.S. Application Data

(60) Provisional application No. 61/783,508, filed on Mar. 14, 2013.

(51) Int. Cl.
| | |
|---|---|
| *H01L 23/48* | (2006.01) |
| *H01L 23/52* | (2006.01) |
| *H01L 29/40* | (2006.01) |
| *H01L 25/00* | (2006.01) |

(52) U.S. Cl.
CPC ............... *H01L 25/00* (2013.01); *H01L 25/50* (2013.01)

(58) Field of Classification Search
None
See application file for complete search history.

(56) References Cited

U.S. PATENT DOCUMENTS

2014/0185264 A1* 7/2014 Chen et al. .................... 361/814

* cited by examiner

*Primary Examiner* — Sonya D McCall Shepard
(74) *Attorney, Agent, or Firm* — Advent, LLP

(57) ABSTRACT

A device and fabrication techniques are described that employ wafer-level packaging techniques to fabricate semiconductor devices that include an embedded integrated circuit chip device and an embedded passive device on a semiconductor wafer device. In implementations, the wafer-level package device includes a semiconductor wafer device, an embedded integrated circuit chip, an embedded passive device, an encapsulation structure covering at least a portion of the semiconductor wafer device, the embedded integrated circuit chip, and the embedded passive device, at least one redistribution layer structure, and at least one solder bump for providing electrical interconnectivity to the devices. Once the wafer is singulated into semiconductor devices, the semiconductor devices may be mounted to a printed circuit board, and the solder bumps may provide electrical interconnectivity through the backside of the device that interface with pads of the printed circuit board.

20 Claims, 5 Drawing Sheets

WAFER-LEVEL PASSIVE DEVICE INTEGRATION

CROSS-REFERENCE TO RELATED APPLICATIONS

The present application claims the benefit under 35 U.S.C. §119(e) of U.S. Provisional Application Ser. No. 61/783,508, filed Mar. 14, 2013, and titled "WAFER-LEVEL PASSIVE DEVICE INTEGRATION." U.S. Provisional Application Ser. No. 61/783,508 is herein incorporated by reference in its entirety.

BACKGROUND

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

SUMMARY

A device and fabrication techniques are described that employ wafer-level packaging techniques to fabricate semiconductor devices that include an embedded integrated circuit chip device and an embedded passive device on a semiconductor wafer device. These wafer-level package devices provide mechanical protection of the embedded integrated circuit chip and passive device contained within the device packages similar to that provided by other devices while maintaining the benefits inherent in wafer-level packaging (e.g., lower cost, smaller package size, high pin count, etc.). In implementations, the wafer-level package device includes a semiconductor wafer device, an embedded integrated circuit chip, an embedded passive device, an encapsulation structure covering at least a portion of the semiconductor wafer device, the embedded integrated circuit chip, and the embedded passive device, at least one redistribution layer structure (i.e., in some implementations, multiple redistribution layers are needed), and at least one solder bump for providing mechanical support and electrical interconnectivity to the devices. Once the wafer is singulated into semiconductor devices, the semiconductor devices may be mounted to a printed circuit board, and the solder bumps may provide electrical interconnectivity through the backside of the device that interface with pads of the printed circuit board.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
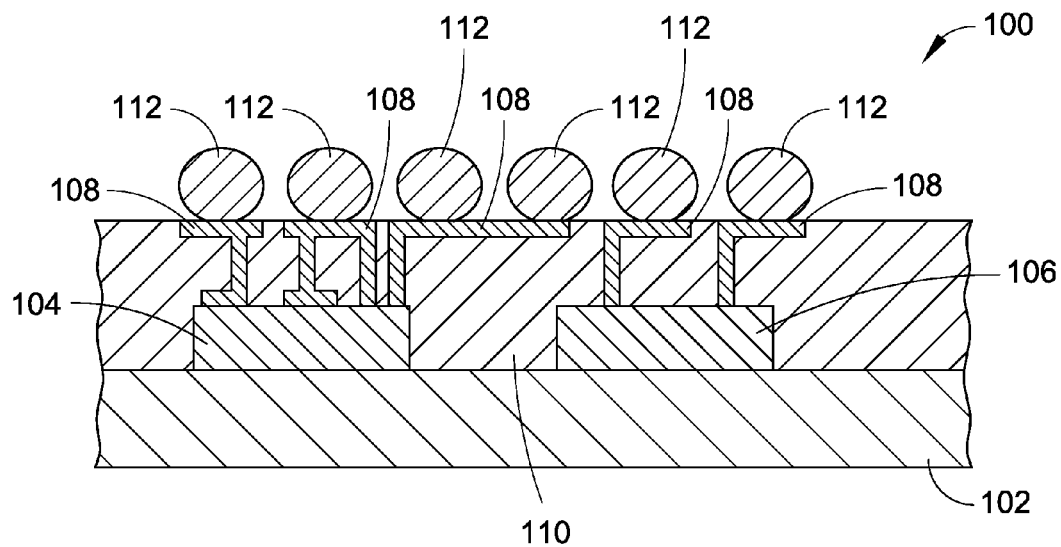
FIG. 1A is a diagrammatic perspective elevation view illustrating a wafer-level package device in accordance with an example implementation of the present disclosure.

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level. Compared to flat no-lead (QFN) packaging techniques, wafer-level packaging is generally less costly to implement since packaging occurs at wafer level, while flat no-lead packaging is performed at strip level.

As the number of computer applications grow, a greater amount of processing functionality and storage functionality provided by integrated circuitry may be required. However, the greater the number of circuitry required may correlate to a greater amount of physical space required in the multimedia devices. A 3D die can be constructed using two or more layers of electronic components integrated into a single device, often from stacking and processing semiconductor wafers. The electronic components may be stacked to form a single electrical circuit. It is advantageous to embed silicon chips as well as passive components onto an semiconductor wafer device for 3D integration in order to improve functionality and simplify the fabrication process.

Accordingly, a wafer-level package device and techniques are described that include embedding an integrated circuit chip device and a passive component onto a semiconductor wafer device. The wafer-level package devices may thus provide mechanical protection of the embedded integrated circuit chip device and the passive components contained within the device packages similar to that provided by other devices while maintaining the benefits inherent in wafer-level packaging (e.g., lower cost, smaller package size, high pin count, etc.). In implementations, the wafer-level package device that employs example techniques in accordance with the present disclosure includes a semiconductor wafer device, an embedded integrated circuit chip device, an embedded passive component, an encapsulation structure covering at least a portion of the semiconductor wafer device, the embedded integrated circuit chip device, and the embedded passive component, a redistribution layer structure (in some implementations, more than one redistribution layer is used), and at least one solder bump for providing electrical interconnectivity. In implementations, a process for fabricating the wafer-level package device that employs example techniques in accordance with the present disclosure includes placing an integrated circuit chip device and a passive device on a processed semiconductor wafer device, forming an encapsulation structure, forming electrical interconnections, and forming at least one solder bump on the electrical interconnections. Once the wafer is singulated into individual semiconductor devices, each semiconductor device including the embedded integrated circuit chip device and passive device may be mounted to a printed circuit board.

Example Implementations

Figure 1B:
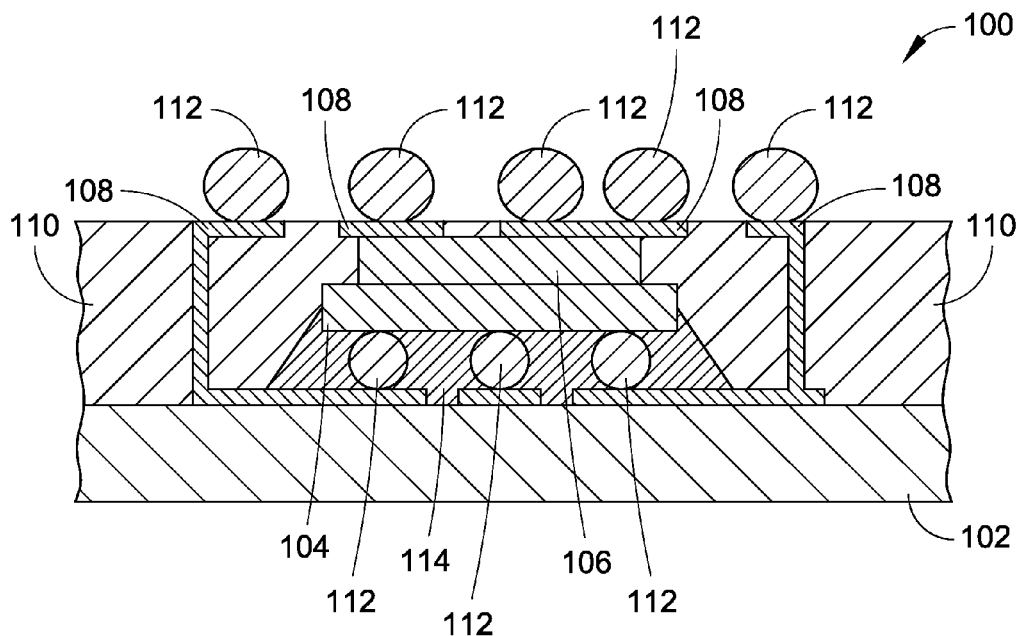
FIG. 1B is a diagrammatic perspective elevation view illustrating a wafer-level package device in accordance with an example implementation of the present disclosure.

FIGS. 1A and 1B illustrate a wafer level package device 100 in accordance with example implementations of the present disclosure. In implementations, the wafer level package device 100 may include wafer-level integrated circuit package devices. As shown, the wafer level package device 100 includes a semiconductor wafer device 102 including one or more integrated circuits formed therein. In implementations, the semiconductor wafer device 102 may include as a portion of a semiconductor wafer substrate, such as a silicon wafer (e.g., p-type wafer, n-type wafer, and so forth), a germanium wafer, and so forth, that includes one or more integrated circuits formed therein. In other implementations, the semiconductor wafer device 102 may include a silicon carrier wafer or another circuit chip device. The integrated circuits may be formed through suitable front-end-of-line (FEOL) fabrication techniques near the surface of the semiconductor wafer substrate. In various implementations, the integrated circuits may include digital integrated circuits, analog integrated circuits, mixed signal integrated circuits, combinations thereof, and so forth.

As shown in FIGS. 1A and 1B, the wafer level package device 100 includes an integrated circuit chip device 104 coupled to the semiconductor wafer device 102. In implementations, the integrated circuit chip device 104 may include one or more integrated circuits formed therein, which may include digital integrated circuits, analog integrated circuits, mixed signal integrated circuits, combinations thereof, etc. Placement of the integrated circuit chip device 104 may include over and/or on the surface of the semiconductor wafer device 102. Additionally, the integrated circuit chip device 104 may be positioned over an electrical interconnection structure (e.g., a redistribution layer, a solder ball array 112, a lead frame, a contact pad, a bonding pad, etc.) disposed on the semiconductor wafer device 102 and may be in electrical communication with the semiconductor wafer device 102 (e.g., using solder bump connections 112, wire leads, through-silicon vias, contact pads, etc). In some implementations and as illustrated in FIGS. 1A and 1B, the integrated circuit chip device 104 may be placed on the semiconductor wafer device 102 using an adhesive. In these implementations, electrical interconnections may include through-silicon vias, contact pads, etc. As shown in FIGS. 1A and 1B, the integrated circuit chip device 104 may be placed on the semiconductor wafer device 102 using flip-chip technology. Flip-chip technology may include a method for interconnecting the integrated circuit chip device 104 to external circuitry (e.g., the semiconductor wafer device 102) with solder bumps 112 that have been deposited onto the integrated circuit chip device 104. The integrated circuit chip device 104 may then be flipped over so that the solder bumps 112 on the top side of the integrated circuit chip device 104 are aligned with matching pads on the semiconductor wafer device 102. Thus, the integrated circuit chip device 104 extends additional functionality to the wafer level package device 100 by enabling system-in-a-package capabilities.

As shown in FIGS. 1A and 1B, the wafer level package device 100 includes a passive device 106 coupled to the semiconductor wafer device 102 and proximate to the integrated circuit chip device 104. In some specific implementations, the passive device 106 may include an inductor, a capacitor, and/or a resistor. In other specific implementations, the passive device 106 includes surface-mount (SMT) energy components. As illustrated in FIGS. 1A and 1B, the passive device 106 may be disposed on the surface of the semiconductor wafer device 102 and adjacent to the integrated circuit chip device 104. In this implementation, the passive device 106 may be attached to the semiconductor wafer device 102 using an adhesive and electrically coupled to the semiconductor wafer device 102 using, for example, through-silicon vias, contact pads, wire leads, etc. As illustrated in FIG. 1B, the passive device 106 may be disposed on the top surface (e.g., distal surface from the semiconductor wafer device 102) of the integrated circuit chip device 104. Further, the integrated circuit chip 104 may be electrically coupled to the semiconductor wafer device 102 using a solder bump 112 array with an underfill 114, and the passive device 106 may be attached to the integrated circuit chip device 104 using an adhesive. In this implementation, the passive device 106 may be electrically coupled to the integrated circuit chip device 104 using through-silicon vias, contact pads, etc. The underfill 114 may include a non-conductive material (e.g., an epoxy-based resin) disposed substantially between the semiconductor wafer device 102 and the integrated circuit chip device 104, where the underfill 114 functions to protect the solder bumps 112 and a portion of the integrated circuit chip device 104 from stress, moisture, contaminants, and other environmental hazards As illustrated in FIGS. 1A and 1B, the wafer level package device 100 includes a redistribution layer structure 108. In implementations, a redistribution layer structure 108 may include a redistribution layer including a thin-film metal (e.g., aluminum, copper, polysilicon, etc.) rerouting and interconnection system that redistributes contact pads on the semiconductor wafer device 102, the integrated circuit chip device 104, and/or the passive device 106 to an array of solder bumps 112 that may be evenly deployed over the semiconductor wafer device 102 and/or the wafer level package device 100. Additionally, the redistribution layer structure 108 may include other interconnection structures, such as contact pads, pillars, under-bump metallization (UBM), metal runs, etc. The redistribution layer structure 108 may be at least partly electrically isolated from other components of the wafer level package device by the encapsulation structure 110 and/or a dielectric or passivation layer, except for connections to, for example, bond pads, the pillars, or metal runs. In some implementations, the integrated circuit chip device 104 and/or the passive device 106 may be electrically connected to the semiconductor wafer device 102 or other semiconductor device components using other techniques (e.g., through-silicon vias, lead wires, etc.).

As illustrated in FIGS. 1A and 1B, the redistribution layer structure 108 may include contact pads disposed on the top surface (e.g., distal from the semiconductor wafer device 102) of the integrated circuit chip device 104 and/or the passive device 106, copper pillars or through-hole vias connected to the contact pads, and a redistribution layer connected to the copper pillars or through-hole vias and configured to provide electrical contact to an array of solder bumps 112 disposed on the surface of an encapsulation structure 110. In another implementation and as illustrated in FIGS. 1A and 1B, a redistribution layer structure 108 may include a first portion of the redistribution layer structure 108 disposed on the surface of the semiconductor wafer device 102 that functions as an electrical connection between the integrated circuit chip device 104 and a second portion of the redistribution layer structure 108 on the surface of the encapsulation structure 110. In this implementation, the integrated circuit chip device 104 may be electrically and structurally connected to the first portion of the redistribution layer structure 108 using a solder bump 112 array, and the first portion of the redistribution layer structure 108 and the second portion of the redistribution layer structure 108 may be connected using vias and/or pillars. As further shown in FIGS. 1A and 1B, a passive device 106 disposed on the integrated circuit chip device 104 may include a redistribution layer electrically coupled to at least one solder bump 112.

The wafer level package device 100 further includes an encapsulation structure 110 configured to encapsulate at least a portion of the semiconductor wafer device 102, the integrated circuit chip device 104, the passive device 106, and at least a portion of the redistribution layer structure 108. In implementations, the encapsulation structure 110 is configured to provide mechanical and/or environmental protection to the semiconductor wafer device 102, the integrated circuit chip device 104, the passive device 106, and/or the redistribution layer structure 108. In some implementations, the encapsulation structure 110 may include a mold compound (e.g., an overmold), a ceramic material, and/or polymer molding compounds, for example, which may include composite materials including epoxy resins, phenolic hardeners, silicas, catalysts, pigments, and mold release agents, etc. In one implementation, the encapsulation structure 110 includes a dielectric layer, such as polybenzoazole (PBO), which encapsulates and/or protects at least a portion of the integrated circuit chip device 104, the passive device 106, and/or the redistribution layer structure 108. In another implementation, the encapsulation structure 110 includes a layer of epoxy, which encapsulates and/or protects the integrated circuit chip device 104 and the passive device 106. Additionally, a portion of the encapsulation structure 110 may be configured to be removed (e.g., during a backgrind or lapping process) to expose pillars or other electrical/mechanical connections that connect to other electrical interconnections (e.g., an RDL structure or solder bump array). Subsequent to forming the redistribution layer structure 108 and/or the encapsulation structure 110, additional layers (e.g., electrical interconnections, additional encapsulation layers, dielectric and/or passivation layers, and/or layers configured to function as electrical/mechanical/structural support) may be added to the wafer-level package device 100 beyond the redistribution layer structure 108.

The wafer level package device 100 includes at least one solder bump 112 that is electrically and/or mechanically coupled to the redistribution layer structure 108 as shown in FIGS. 1A and 1B. The at least one solder bump 112 may serve to furnish mechanical and/or electrical interconnection between the redistribution layer structure 108 and corresponding contact pads of another semiconductor device (e.g., a printed circuit board, another integrated circuit, etc.). The at least one solder bump 112 may be of various sizes and array pitches. In one specific implementation, an array of solder bumps 112 may include solder bumps 112 having a diameter of 50 μm and a pitch of 0.5 mm. It is contemplated that other solder bump 112 diameters and pitches may be suitable for use in the wafer level package device 100. In implementations, the solder bump 112 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, etc. In some implementations, the at least one solder bump 112 may include a fan-out configuration of solder bumps where the solder bumps 112 are arranged in a large array.

Further, the wafer-level package device 100 may be singulated into individual semiconductor devices subsequent to the formation of additional layers and coupled to a printed circuit board (not shown), thereby forming an electronic device. A printed circuit board may include a circuit board used to mechanically support and electrically connect electronic components (e.g., the individual semiconductor devices) using conductive pathways, tracks or signal traces etched from copper sheets laminated onto a non-conductive substrate.

Example Fabrication Processes

Figure 2:
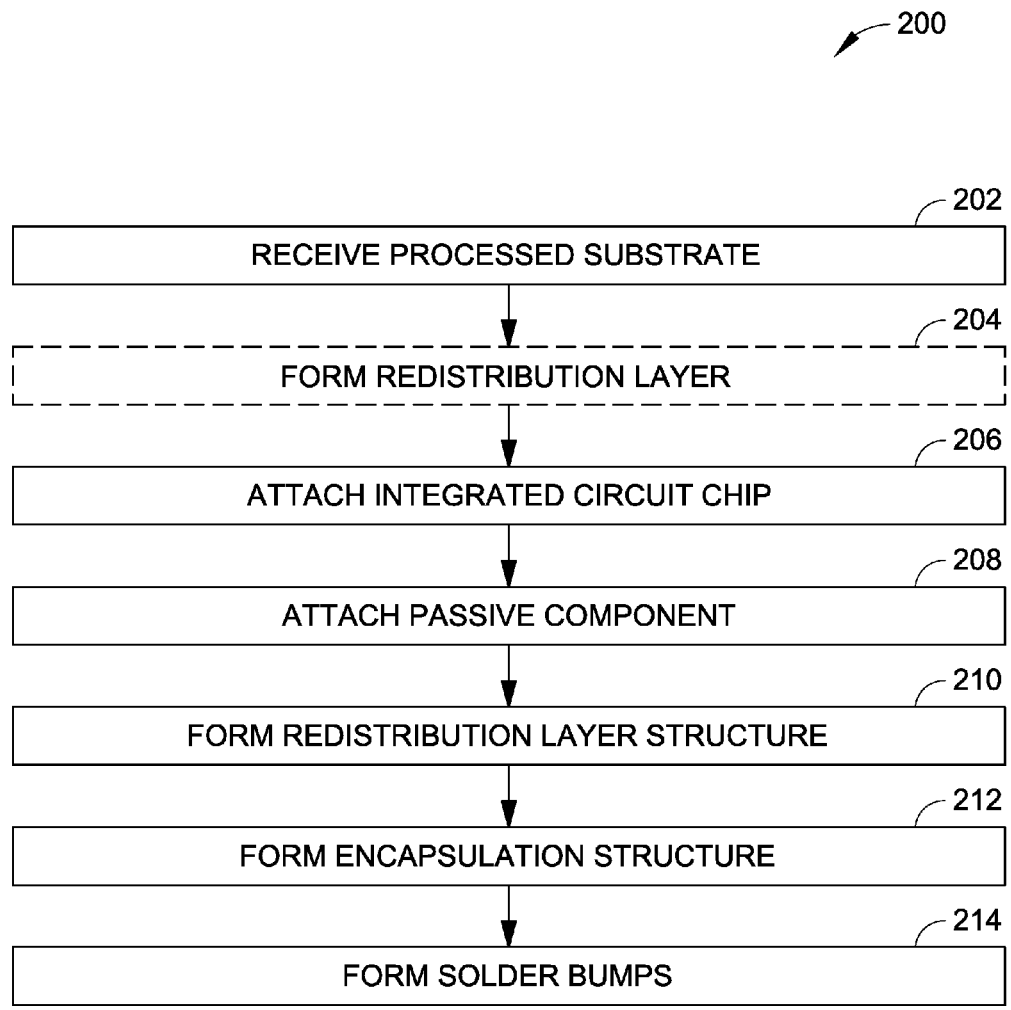
FIG. 2 is a flow diagram illustrating a process in an example implementation for fabricating wafer-level package devices, such as the devices shown in FIGS. 1A through 2B.

FIG. 2 illustrates an example process 200 that employs wafer-level packaging techniques to fabricate semiconductor devices including an embedded integrated circuit chip device 104 and an embedded passive device 106, such as the wafer level package device 100 shown in FIGS. 1A and 1B. FIGS. 3A through 3F illustrate sections 300 of an example embedded integrated circuit chip device 304 and embedded passive device 306 that are utilized to fabricate semiconductor devices (such as wafer level package device 100 shown in FIGS. 1A and 1B).

Figure 3A:
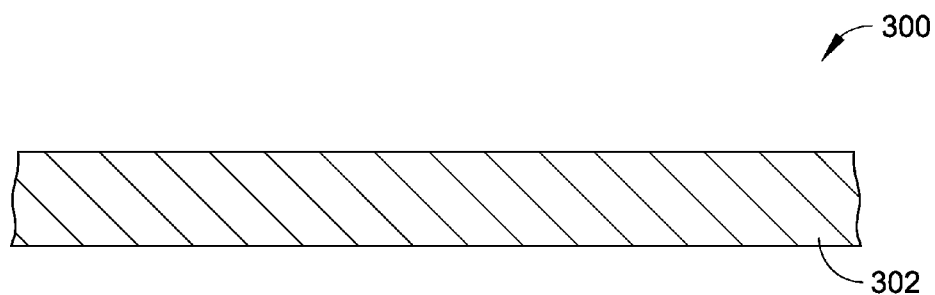
FIG. 3A is a diagrammatic partial cross-sectional side elevation view illustrating the fabrication of a wafer-level package device, such as the device shown in FIGS. 1A and 1B, in accordance with the process shown in FIG. 2.

Accordingly, an semiconductor wafer device is processed (Block 202). FIG. 3A illustrates a portion of the semiconductor wafer device 302, which, when processed through suitable front end-of-line (FEOL) fabrication techniques, includes a semiconductor substrate that includes one or more integrated circuits formed therein. The processed integrated circuits may be configured in a variety of ways. For example, processing the integrated circuits may include processing digital integrated circuits, analog integrated circuits, mixed-signal integrated circuits, etc. The processed integrated circuits are connected to one or more conductive layers (e.g., bump interfaces, redistribution layers, etc.) that provide electrical contacts through which the integrated circuits are interconnected to other components associated with the semiconductor wafer device 302, such as printed circuit boards, an integrated circuit chip device 304, a passive device 306, etc. In an implementation, processing a semiconductor wafer device 302 includes processing a silicon wafer configured to receive a pick-and-placed integrated circuit chip device 304 and/or passive device 306, where the silicon wafer has been processed using FEOL techniques. In some implementations, the semiconductor wafer device 302 may include an active device silicon wafer.

Figure 3B:
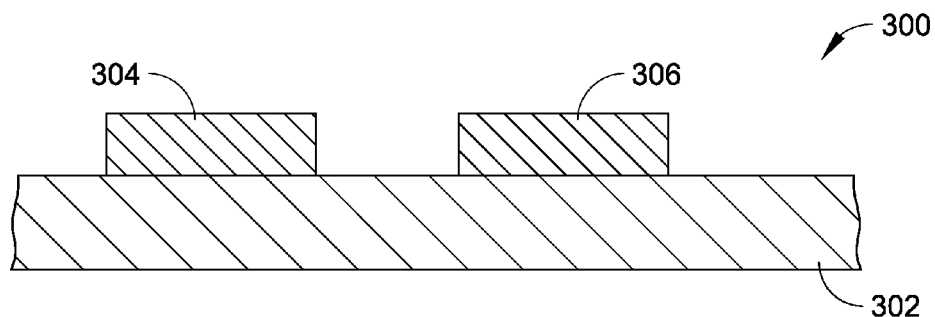
FIG. 3B is a diagrammatic partial cross-sectional side elevation view illustrating the fabrication of a wafer-level package device, such as the device shown in FIGS. 1A and 1B, in accordance with the process shown in FIG. 2.
Figure 3C:
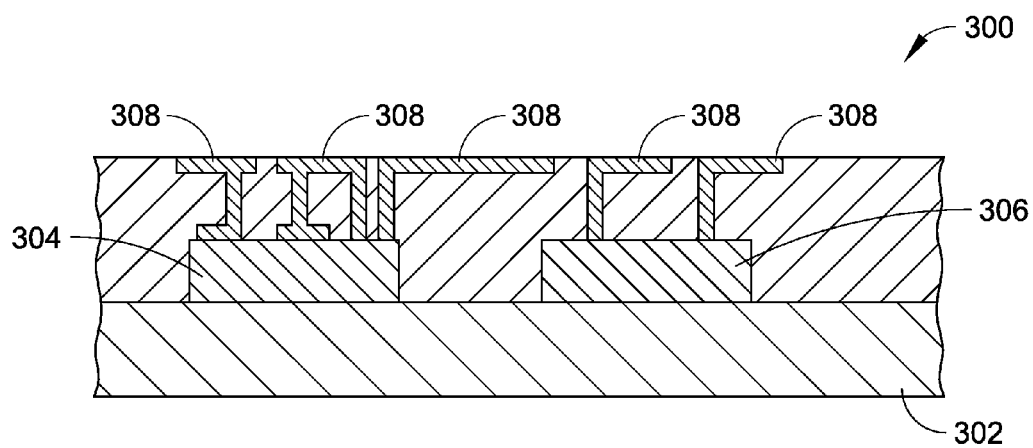
FIG. 3C is a diagrammatic partial cross-sectional side elevation view illustrating the fabrication of a wafer-level package device, such as the device shown in FIGS. 1A and 1B, in accordance with the process shown in FIG. 2.
Figure 3D:
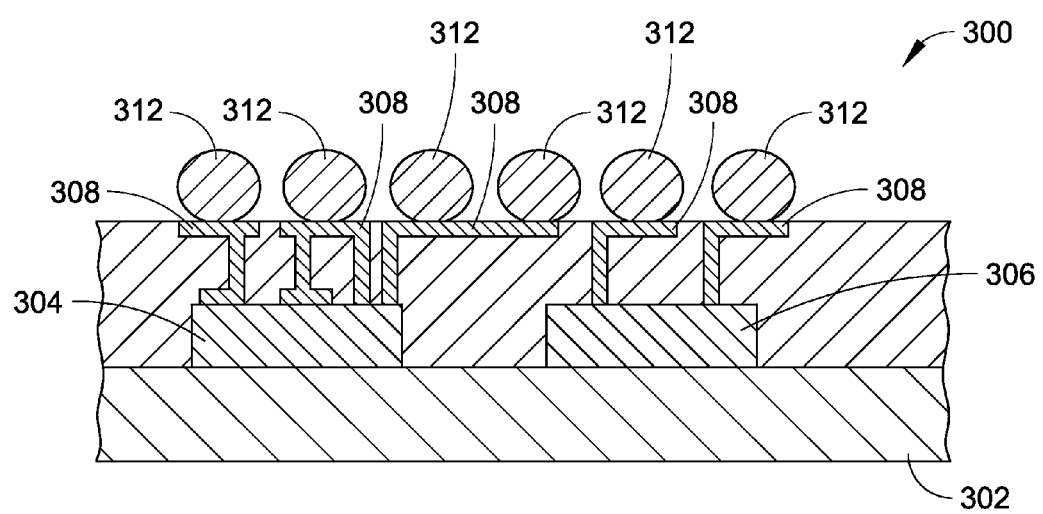
FIG. 3D is a diagrammatic partial cross-sectional side elevation view illustrating the fabrication of a wafer-level package device, such as the device shown in FIGS. 1A and 1B, in accordance with the process shown in FIG. 2.
Figure 3E:
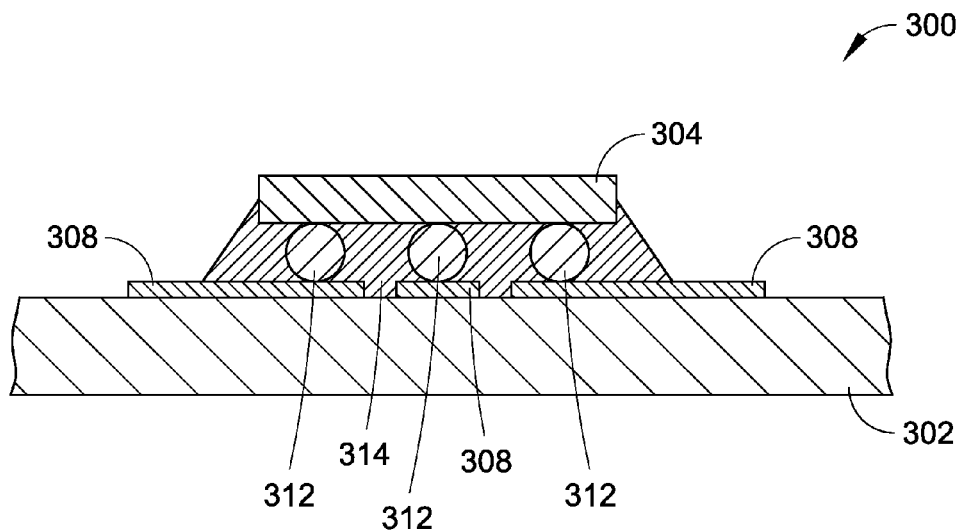
FIG. 3E is a diagrammatic partial cross-sectional side elevation view illustrating the fabrication of a wafer-level package device, such as the device shown in FIGS. 1A and 1B, in accordance with the process shown in FIG. 2.

A first redistribution layer may be formed on the semiconductor wafer device (Block 204). As illustrated in FIG. 3E, forming a redistribution layer structure 308 may include forming a first portion of the redistribution layer structure 108 on the semiconductor wafer device 302 configured to function as an electrical connection between the integrated circuit chip device 304 and a second portion of the redistribution layer structure 108 formed on another layer (e.g., the encapsulation structure 310, further discussed below and illustrated in FIG. 3F). In some implementations, forming the redistribution layer structure 308 may include forming a redistribution layer as well as forming corresponding bonding pads, underbump metallization (UBM), through-silicon vias (TSVs), wiring and/or metal layers, and other electrical interconnections and passivation layers. In implementations, forming (e.g., using deposition methods) a redistribution layer structure 308 includes forming a redistribution layer that includes an UBM and a bonding pad that is coupled to at least one pillar via line metallization. In embodiments, forming the redistribution layer structure 308 may include forming a conductive material, such as polysilicon, or a metal, such as aluminum or copper, which may be patterned and applied over a passivation layer or an isolation layer.

An integrated circuit chip device is then placed on the semiconductor wafer device (Block 206). FIGS. 3B and 3E illustrate placing the integrated circuit chip device 304 on the semiconductor wafer device 302 and/or the first redistribution layer of a redistribution structure 308. The integrated circuit chip device 304 may be placed on the semiconductor wafer device 302 using various methods and techniques. In some implementations, the integrated circuit chip device 304 may be placed on the semiconductor wafer device 302 using flip chip technology and solder bumps 312. Attaching or placing the integrated circuit chip device 304 on the semiconductor wafer device 302 may include interconnecting the semiconductor wafer device 302 with bonding pads, for example. As illustrated in FIG. 3B, placing or mounting the integrated circuit chip device 304 to circuitry (e.g, a circuit board, the semiconductor wafer device 302, etc.) may include flipping the integrated circuit chip device 304 (e.g., a flip chip) so that a side with electrical connections faces down, and the integrated circuit chip device 304 may be aligned so that its electrical connection pads align with matching pads on the semiconductor wafer device 302. A subsequent reflow process may be used to melt and secure the solder bumps 312 to bump interfaces.

In other implementations and as illustrated in FIG. 3E, the integrated circuit chip device 304 may be attached using die attach technology employing an adhesive, such as polyimide, epoxy, or silver-filled glass. In these implementations, the adhesive may be dispensed in a controlled amount on the semiconductor wafer device 302, and the integrated circuit chip device 304 may be then attached to the semiconductor wafer device 302. Additionally, pillars or other electrical interconnections (e.g., through-silicon vias, wires, metal, etc.) and passivation layers included as a portion of the integrated circuit chip device 304 may be formed on or from the integrated circuit chip device 304 using lithography, deposition, etching, and/or electroplating processes. In some embodiments, placing the integrated circuit chip device 304 may include placing the integrated circuit chip device 304 on the semiconductor wafer device 302 utilizing pick-and-place technology (e.g., using a flip-chip configuration). In this embodiment, placing the integrated circuit chip device 304 may include forming an underfill 314 between the integrated circuit chip device 304 and the semiconductor wafer device 302 and between the solder bumps 312 of the integrated circuit chip device 304. Pick-and-place technology may include using automated machines to place surface-mount devices (e.g., the integrated circuit chip device 304) onto a substrate (e.g., the semiconductor wafer device 302).

A passive device is then placed on the wafer level package device (Block 208). In an embodiment and illustrated in FIG. 3B a passive device 306 is placed on the semiconductor wafer device 302 and proximate (e.g., in a side-by-side configuration) to the integrated circuit device 304. In this embodiment, the passive device 306 is attached to the semiconductor wafer device 302 using an adhesive and electrical interconnections (e.g., contact pads, through-hole vias, wire leads, etc.). In some implementations, placing the passive device 306 may include using a pick-and-place process, such as that described above. In another embodiment and illustrated in FIG. 3E, placing the passive device 306 may include placing the passive device 306 on the top surface (e.g., distal from the semiconductor wafer device 302) of the integrated circuit chip device 304. In this embodiment, placing the passive device 306 may include using an adhesive to attach the passive device 306 to the integrated circuit chip device 304. Additionally, the passive device 306 may include a redistribution layer formed on the top surface (e.g., distal from the integrated circuit chip device 304) and configured to be included in the redistribution layer structure 308 and provide an electrical connection to at least one solder bump 312.

Figure 3F:
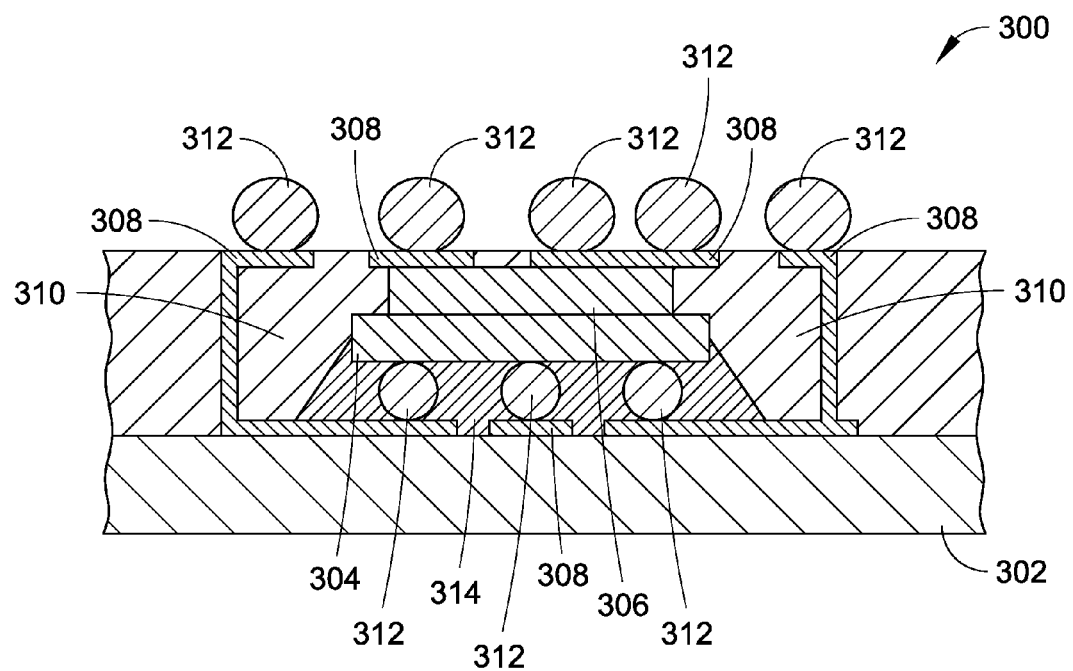
FIG. 3F is a diagrammatic partial cross-sectional side elevation view illustrating the fabrication of a wafer-level package device, such as the device shown in FIGS. 1A and 1B, in accordance with the process shown in FIG. 2.

A redistribution layer structure is formed on the wafer level package device (Block 210). FIGS. 3C and 3F illustrates a redistribution layer structure 308 formed on and coupled to the electrical interconnections (e.g., pillars, through-silicon vias, redistribution layer, UBMs, contact pads, bonding pads). Forming the redistribution layer structure 308 may include forming a redistribution layer (e.g., metal lines) as well as forming corresponding bonding pads, underbump metallization (UBM), through-silicon vias (TSVs), wiring and/or metal layers, and other electrical interconnections and passivation layers. In implementations, forming a redistribution layer structure 308 includes forming a redistribution layer that includes an UBM and a bonding pad that is coupled to at least one pillar using line metallization. In embodiments, forming the redistribution layer structure 308 may include forming a conductive material, such as polysilicon, or a metal, such as aluminum or copper, which may be applied and patterned over a passivation layer or an isolation layer.

An encapsulation structure is formed over the integrated circuit chip device and semiconductor wafer device to at least substantially encapsulate the integrated circuit chip device (Block 212). FIGS. 3C and 3F illustrate forming the encapsulation structure 310 over the integrated circuit chip device 304 and semiconductor wafer device 302 to function as structural support and electrical insulation to the integrated circuit chip device 304 and/or corresponding interconnection (e.g., pillars, a first redistribution layer). In implementations, forming the encapsulation structure 310 may include using a suitable compound (e.g., epoxy, polymers, etc.) for depositing on the semiconductor wafer device 302, the integrated circuit chip device 304, the passive device 306, and the redistribution layer structure 308 to form the encapsulation structure 310. In a specific implementation, forming an encapsulation structure 310 over the integrated circuit chip device 304, the semiconductor wafer device 302, and the passive device 306 includes applying a molding compound and hardening the molding compound to form the encapsulation structure 310. Other processes for forming an encapsulation structure 310 may be utilized (e.g. spin-coating techniques, deposition techniques, etc.).

At least one solder bump is formed on the redistribution layer structure (Block 214). The solder bumps 312 may be formed using various ways. In one implementation, the solder bumps 312 are formed using a ball drop process. It is contemplated that other techniques such as solder paste printing, evaporation, electroplating, jetting, stud bumping, and so on may be used to form the solder bumps 312. In one implementation, forming solder bumps 312 include applying solder paste to predetermined locations on the redistribution layer structure 308 configured to be subsequently reflowed and form the final connections between the wafer level package device and another component (e.g., printed circuit board, other integrated circuit chip, etc.). In another embodiment, at least one solid, pre-formed solder ball may be dropped using a ball drop process. In another embodiment, forming at least one solder bump 312 on the redistribution layer structure 308 includes placing a solder ball in a liquid or molten form on a redistribution layer structure 308 (e.g., on a solder tab that is included as a portion of the redistribution layer structure 308). In both of these embodiments, the solder ball may be bonded to the underlying redistribution layer structure 308 to form a solder bump 312 by heating the solder ball and the contact material.

Once the solder bumps 312 are formed, suitable processes may be employed to add additional layers and wafer-level package device components as desired and segment the wafer-level package device into individual integrated circuit chips and individual packages.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level package device comprising: a segmented semiconductor wafer section configured to function as a base layer; an integrated circuit chip device coupled to the segmented semiconductor wafer section;
   a passive device disposed proximate to the integrated circuit chip device and coupled to the segmented semiconductor wafer section;
   at least one pillar electrically coupled to the integrated circuit chip device and at least one pillar electrically coupled to the passive device;
   an encapsulation layer covering at least a portion of the segmented semiconductor wafer section, the integrated circuit chip device, and the passive device;
   a redistribution layer structure coupled to the at least one pillar; and
   at least one solder bump coupled to the redistribution layer structure and disposed on a surface of the encapsulation layer distal from the segmented semiconductor wafer section.

2. The wafer-level package device as recited in claim 1, wherein the segmented semiconductor wafer section includes a silicon wafer.

3. The wafer-level package device as recited in claim 1, wherein the encapsulation layer includes an epoxy overmold.

4. The wafer-level package device as recited in claim 1, wherein the at least one pillar includes at least one copper pillar.

5. The wafer-level package device as recited in claim 1, wherein the passive device includes a passive device with at least one copper pillar configured to provide an electrical interconnection.

6. The wafer-level package device as recited in claim 1, wherein the passive device includes a passive device that is electrically connected with the integrated circuit chip device.

7. The wafer-level package device as recited in claim 1, wherein the passive device includes a resistor.

8. The wafer-level package device as recited in claim 1, wherein the passive device includes a capacitor.

9. An electronic device comprising:
   a printed circuit board; and
   a wafer level-package device coupled to the printed circuit board, the wafer-level package device including
      a segmented semiconductor wafer section configured to function as a base layer;
      an integrated circuit chip device coupled to the segmented semiconductor wafer section;
      a passive device coupled to the segmented semiconductor wafer section and disposed proximate to the integrated circuit chip device;
      at least one pillar coupled to the integrated circuit chip device and configured to provide an electrical interconnection to the integrated circuit chip device;
      an encapsulation layer covering at least a portion of the segmented semiconductor wafer section, the integrated circuit chip device, and the passive device;
      a redistribution layer structure coupled to at least the integrated circuit chip device; and
      at least one solder bump coupled to the redistribution layer structure and disposed on a surface of the encapsulation layer distal from the segmented semiconductor wafer section.

10. The electronic device as recited in claim 9, wherein the segmented semiconductor wafer section includes a silicon carrier.

11. The electronic device as recited in claim 9, wherein the at least one pillar includes at least one copper pillar.

12. The electronic device as recited in claim 9, wherein the encapsulation layer includes an epoxy overmold.

13. The electronic device as recited in claim 9, wherein the passive device includes a passive device with at least one copper pillar configured to provide an electrical interconnection.

14. The electronic device as recited in claim 9, wherein the passive device includes a passive device that is electrically connected with the integrated circuit chip device.

15. A process comprising:
   processing a segmented semiconductor wafer section configured to function as a base layer;
   placing an integrated circuit chip device on the segmented semiconductor wafer section, where the integrated circuit chip device includes at least one pillar configured to provide an electrical interconnection to the integrated circuit chip device;
   placing a passive device on the segmented semiconductor wafer section and proximate to the integrated circuit chip device;
   forming an encapsulation layer over the segmented semiconductor wafer section, the integrated circuit chip device, and the passive device;

facegrinding the encapsulation layer to at least partially expose the electrical interconnection;

forming a redistribution layer structure on the encapsulation layer, where the redistribution layer is electrically coupled to the electrical interconnection; and forming at least one solder bump on the redistribution layer structure, the at least one solder bump disposed on a surface of the encapsulation layer distal from the segmented semiconductor wafer section.

16. The process as recited in claim 15, wherein processing the segmented semiconductor wafer section includes processing a silicon wafer.

17. The process as recited in claim 15, wherein the at least one pillar includes at least one copper pillar.

18. The process as recited in claim 15, wherein forming the encapsulation layer includes forming an epoxy overmold.

19. The process as recited in claim 15, wherein placing the passive device includes placing the passive device with at least one copper pillar configured to provide an electrical interconnection.

20. The process as recited in claim 15, wherein placing the passive device includes placing a passive device that is electrically connected with the integrated circuit chip device.

* * * * *